US007759687B2

(12) United States Patent
Wu

(10) Patent No.: US 7,759,687 B2
(45) Date of Patent: Jul. 20, 2010

(54) MULTI-WAVELENGTH LED ARRAY PACKAGE MODULE AND METHOD FOR PACKAGING THE SAME

(75) Inventor: Ming-Che Wu, Nan-Tou (TW)

(73) Assignee: Universal Scientific Industrial Co., Ltd., Nan-Tou (TW)

( * ) Notice: Subject to any disclaimer, the term of this patent is extended or adjusted under 35 U.S.C. 154(b) by 144 days.

(21) Appl. No.: 12/003,689

(22) Filed: Dec. 31, 2007

(65) Prior Publication Data

US 2009/0166647 A1 Jul. 2, 2009

(51) Int. Cl.
*H01L 29/20* (2006.01)

(52) U.S. Cl. .......................................... 257/89; 438/22

(58) Field of Classification Search .................. 257/89; 438/22
See application file for complete search history.

(56) References Cited

U.S. PATENT DOCUMENTS 6,414,246 B1 * 7/2002 Palmteer .................... 174/255
2007/0029926 A1 * 2/2007 Lee et al. .................... 313/503
2007/0053392 A1 * 3/2007 Moto .................... 372/29.011
2007/0145398 A1 * 6/2007 Shin ............................ 257/98

* cited by examiner

*Primary Examiner*—Thanh V Pham
*Assistant Examiner*—Jami M Valentine
(74) *Attorney, Agent, or Firm*—Kile Goekjian Reed & McManus PLLC

(57) ABSTRACT

A method for packaging a multi-wavelength LED array package module includes: forming at least one concave groove on a drive IC structure; arranging a multi-wavelength LED array set in the at least one concave groove; solidifying a plurality of liquid conductive materials to form a plurality of conductive elements that is electrically connected between the drive IC structure and the multi-wavelength LED array set by a printing, a coating, a stamping, or a stencil printing process; arranging the drive IC structure on a PCB with at least one input/output pad; and then forming a conductive structure that is electrically connected between the drive IC structure and the at least one input/output pad.

11 Claims, 19 Drawing Sheets

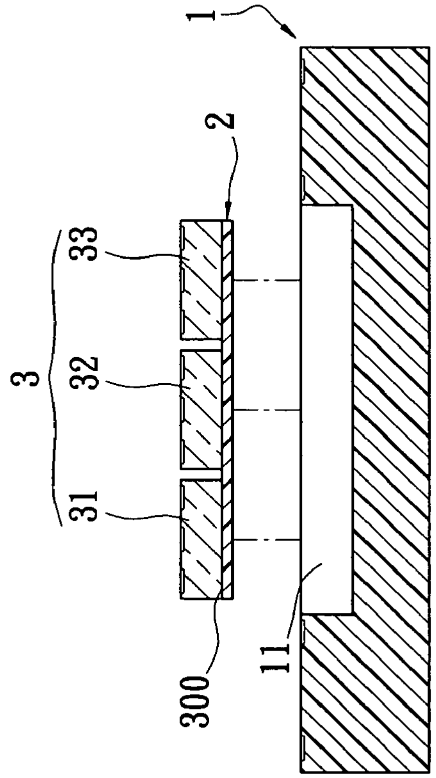
FIG. 5A1
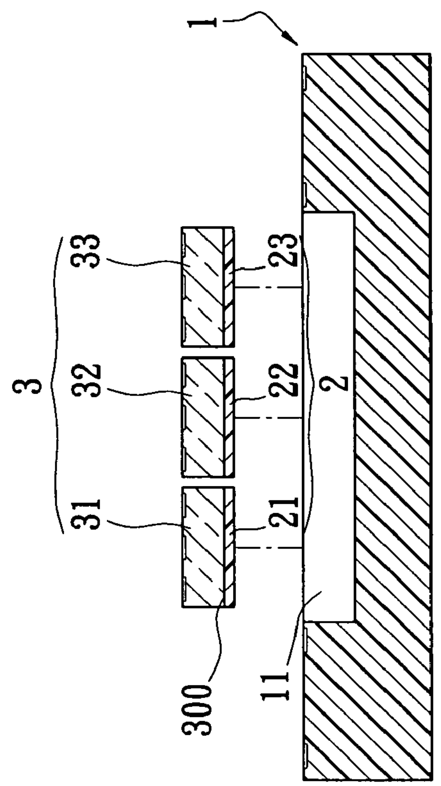
FIG. 5A3
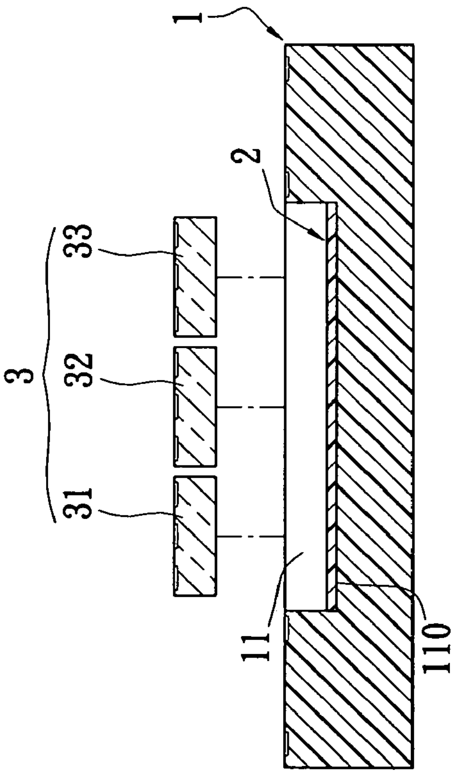
FIG. 5A2

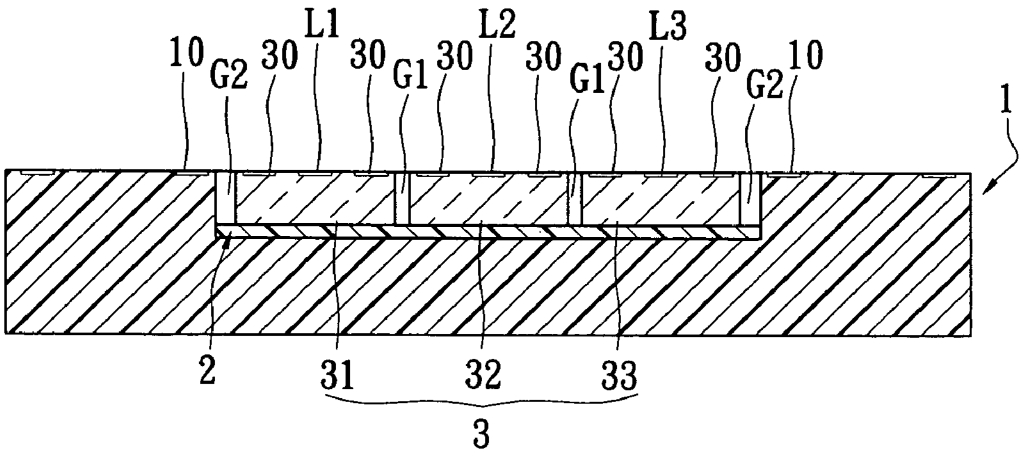
FIG. 5B1
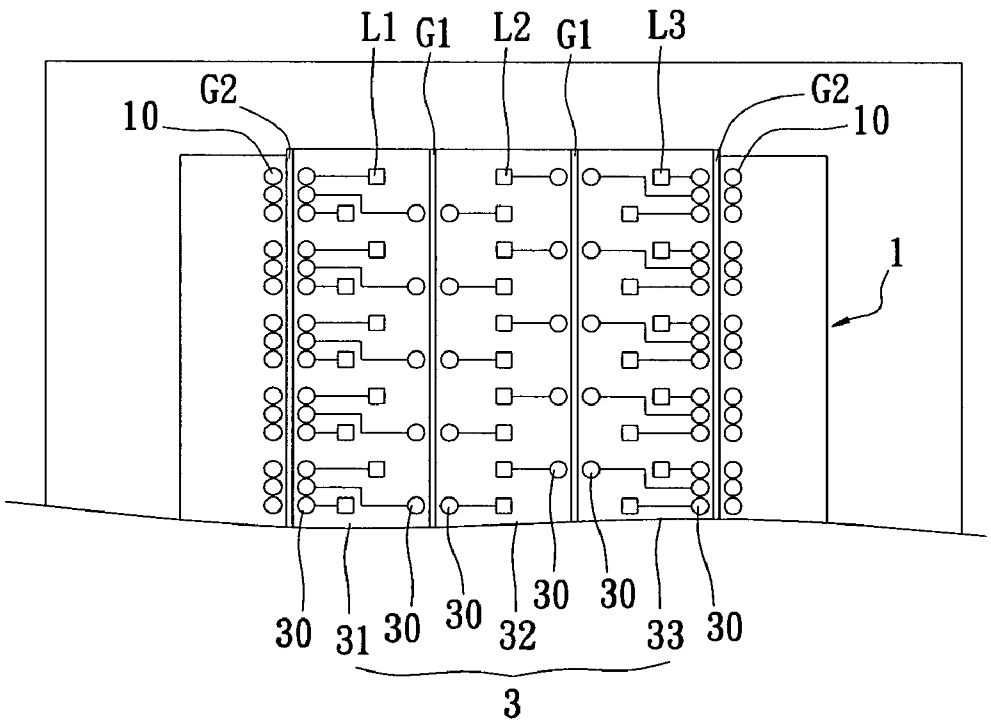
FIG. 5B2

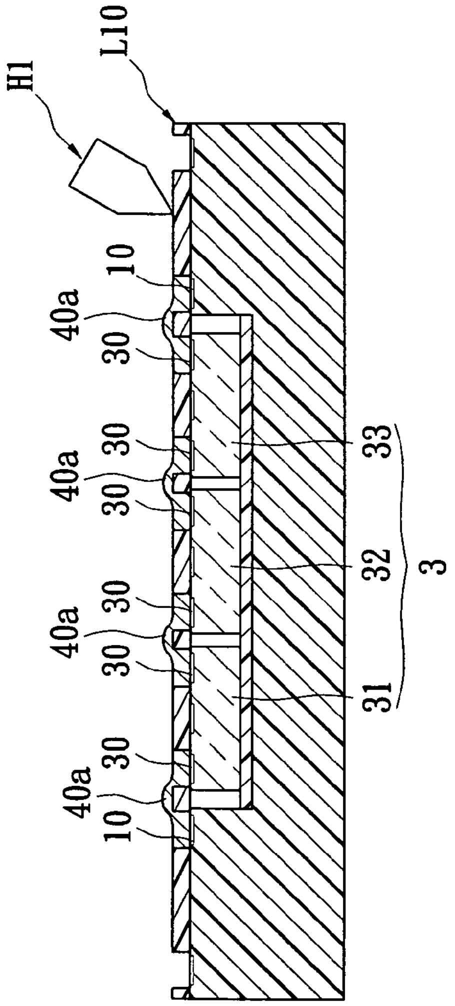
FIG. 5E1
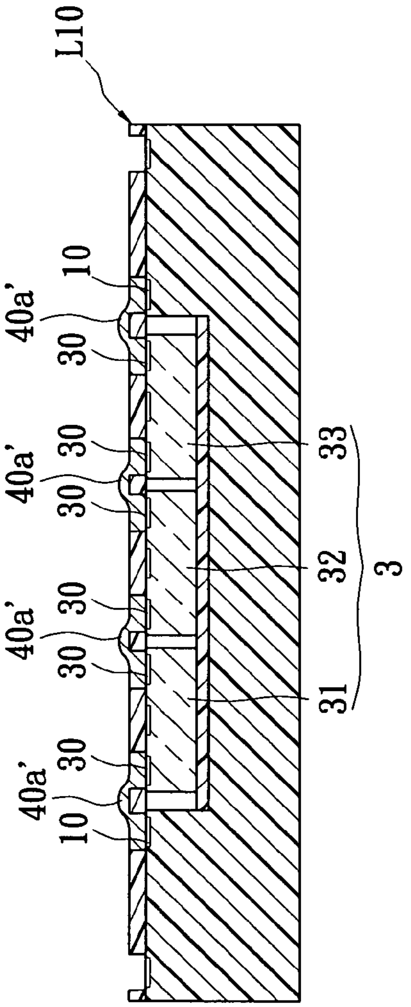
FIG. 5E2

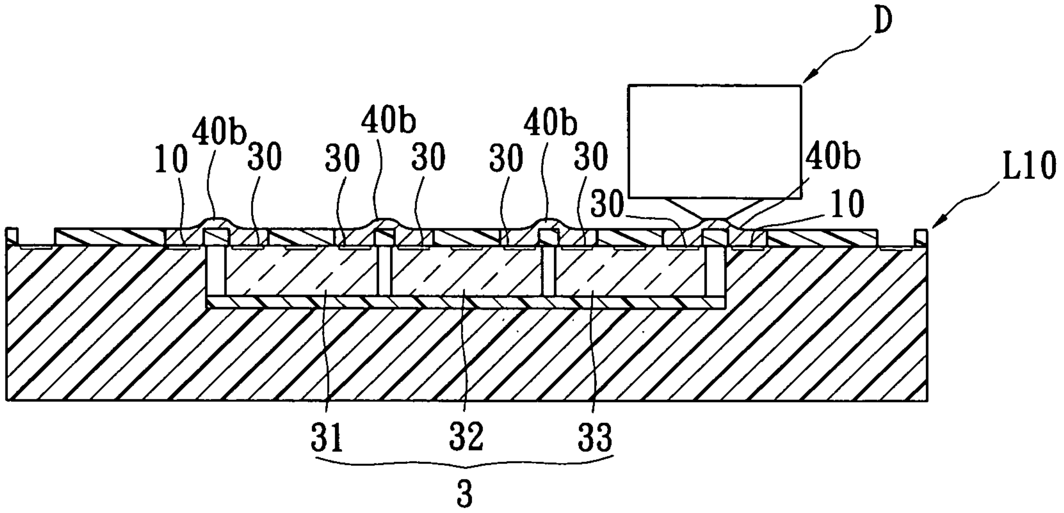
FIG. 7D1
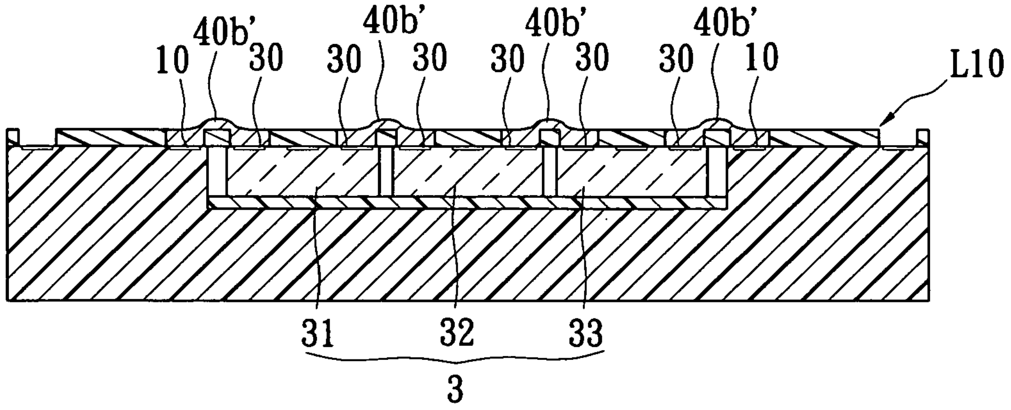
FIG. 7D2

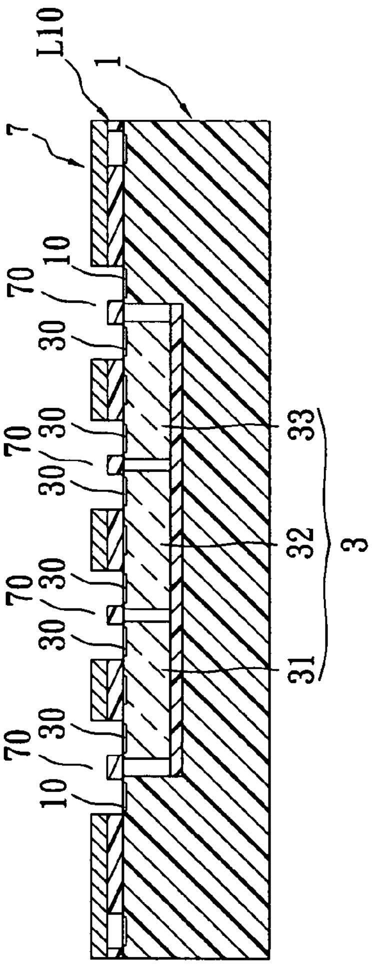
FIG. 9A
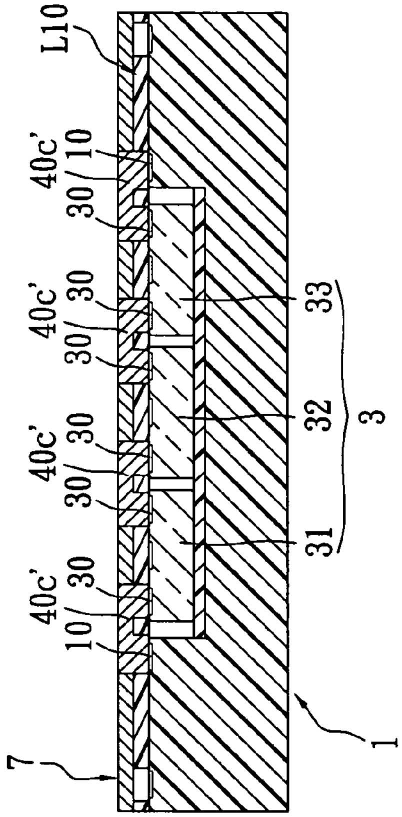
FIG. 9B2
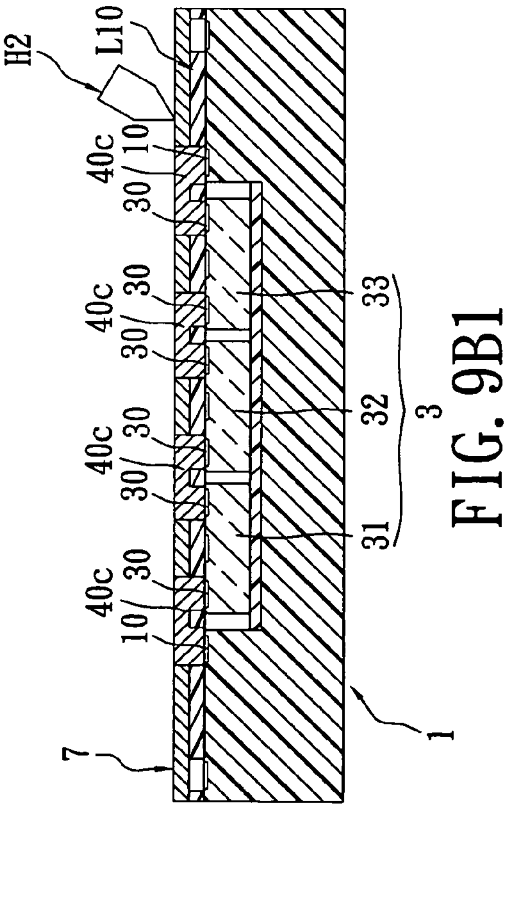
FIG. 9B1

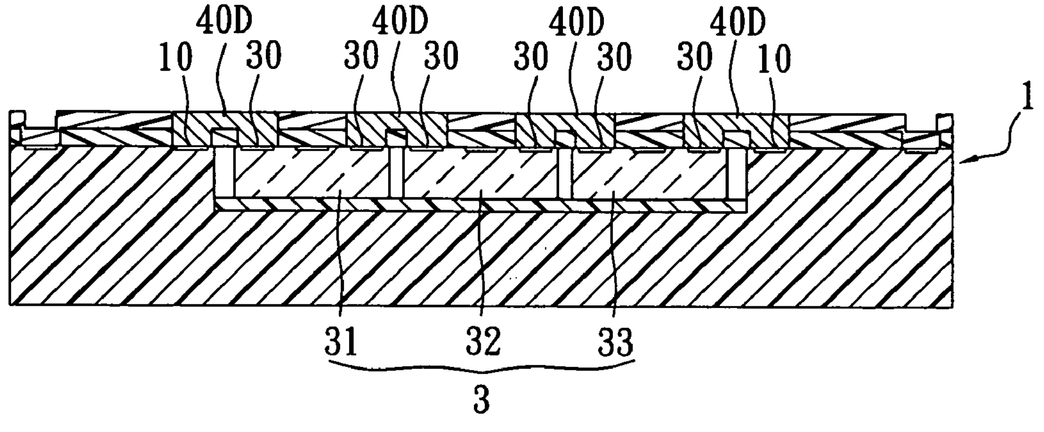
FIG. 11C1
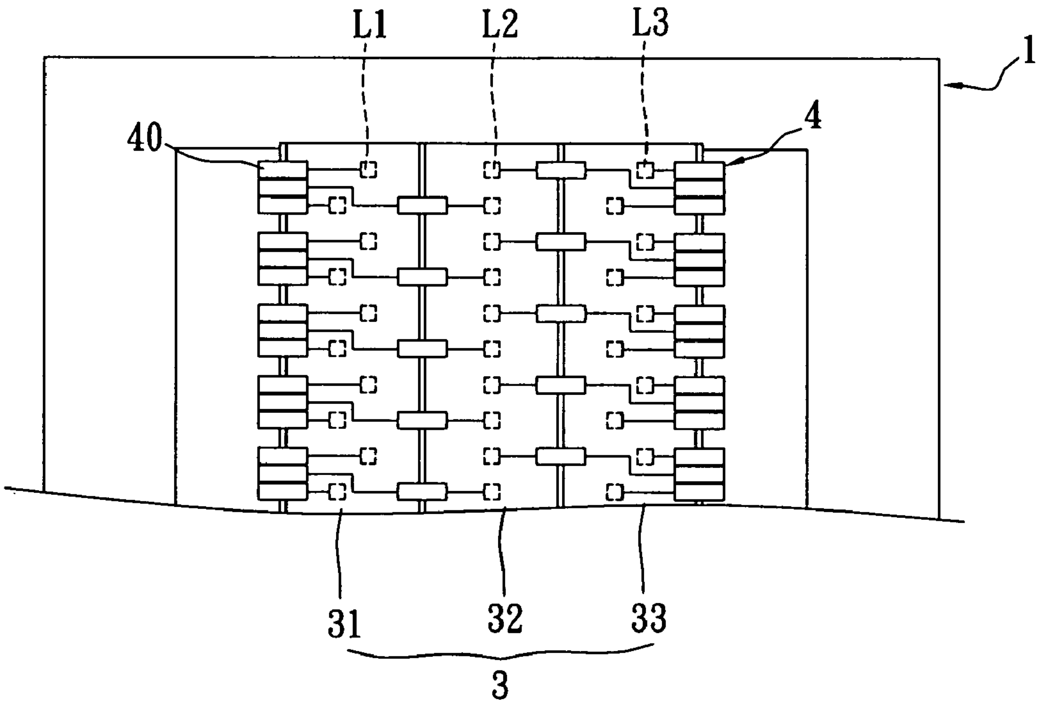
FIG. 11C2

MULTI-WAVELENGTH LED ARRAY PACKAGE MODULE AND METHOD FOR PACKAGING THE SAME

BACKGROUND OF THE INVENTION

1. Field of the Invention

The present invention relates to a package module and a method for packaging the same, and particularly relates to a multi-wavelength LED array package module and a method for packaging the same.

2. Description of the Related Art

In the typical printer technology, a laser is used as a light source in a printer head to scan and transfer the printing information as light signals to a rotating drum in order to generate electrostatic latent images formed on the rotating drum. Moreover, the printing method further includes a toner absorbing step, a transferring step, a hot pressing step, an electrostatic discharging step etc. to achieve printing requirement. However, a laser printer head of the prior art has many optical components, and the mechanism of the laser printer head is complex and the optical path of the laser printer head is very longer. Hence, the optical structure is quite complex and difficult to reduce in size for using a laser in this way. Therefore, the current trend is toward using light emitting diodes to replace lasers as the light sources in printer heads, which can simplify the optical structure.

A further requirement is to reduce the volume of each light emitting diode so as to increase the resolution of the printer. More light emitting diodes may be constructed per unit area in the printer head when the volume of each light emitting diode is reduced. According to the typical packaging method, a highly precise packaging apparatus is required to arrange the light emitting diode arrays and the driver integrated circuits so that they are exactly parallel to each other in a printed circuit board. Then, a wire bonding process is performed to form about 5000 wires between the light emitting diode arrays and the driver integrated circuits if the resolution of the printer is 600 dpi (dots per inch) of A4 size paper. The driver integrated circuits drive the light emitting diode arrays through these wires.

A highly exact and dense wire bonding process in the foregoing method increases the difficulty of the packaging process. This reduces the product yield and indirectly raises the manufacturing cost. Moreover, according to the need of high resolution of the printer, the wire bonding process is more difficult due to the more and more small size of the light emitting diodes.

SUMMARY OF THE INVENTION

One particular aspect of the present invention is to provide a multi-wavelength LED array package module and a method for packaging the same in order to reduce product size and manufacturing cost.

In order to achieve the above-mentioned aspects, the present invention provides a method for packaging a multi-wavelength LED array package module. The method includes forming at least one concave groove on a top side of a drive IC structure; receiving a multi-wavelength LED array set in the at least one concave groove; and forming a plurality of conductive elements electrically connected between the drive IC structure and the multi-wavelength LED array set.

In order to achieve the above-mentioned aspects, the present invention provides a multi-wavelength LED array package module, including a drive IC structure, a multi-wavelength LED array set, and a multi-wavelength LED array set.

The drive IC structure has at least one concave groove formed on a top side thereof. The multi-wavelength LED array set is received in the at least one concave groove. The conductive elements are electrically connected between the drive IC structure and the multi-wavelength LED array set.

Hence, the present invention utilize printing, coating, stamping or stencil printing to manufacture a conductive structure for electrically connecting between the multi-wavelength LED array set and the drive IC structure and between each two LED arrays without using wire-bonding process such as prior art that needs to take a long time. Hence, the present invention not only can reduce product size, material cost, and manufacturing cost, but also increases production speed.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which:

FIGS. 5A1 to 5G are cross-sectional, schematic views of a packaging process according to the first embodiment of the present invention;

FIGS. 7A to 7E are cross-sectional, schematic views of a packaging process according to the second embodiment of the present invention;

FIGS. 9A to 9C are cross-sectional, schematic views of a packaging process according to the third embodiment of the present invention.

FIGS. 11A to 11E are cross-sectional, schematic views of a packaging process according to the fourth embodiment of the present invention.

DETAILED DESCRIPTION OF THE PREFERRED EMBODIMENTS

Referring to FIGS. 1 to 4 and 5A1 to 5G, the first embodiment of the present invention provides a method for packaging a multi-wavelength LED array package module. The method of the first embodiment includes: referring to FIGS. 2 to 4, providing a wafer W that has been patterned, and the wafer having a plurality of drive IC (Integrated Circuit) structures 1 and each drive IC structure 1 having a plurality of drive IC pads 10 (S100); and forming at least one concave groove 11 (that is a receiving space) on a top side of the drive IC structure 1 (S102). The drive IC pads 10 are straightly arranged near two sides of the at least one concave groove 11 and on the drive IC structure 1. The at least one concave groove 11 is formed on the top side of the drive IC structure 1 via dry etching, wet etching, machining, or any forming method.

Referring to FIGS. 5A1 to 5G again, the step S1 discloses the manufacturing processes of each drive IC structure 1. The step S1 includes the step S104*a* to step S116.

Figure 1:
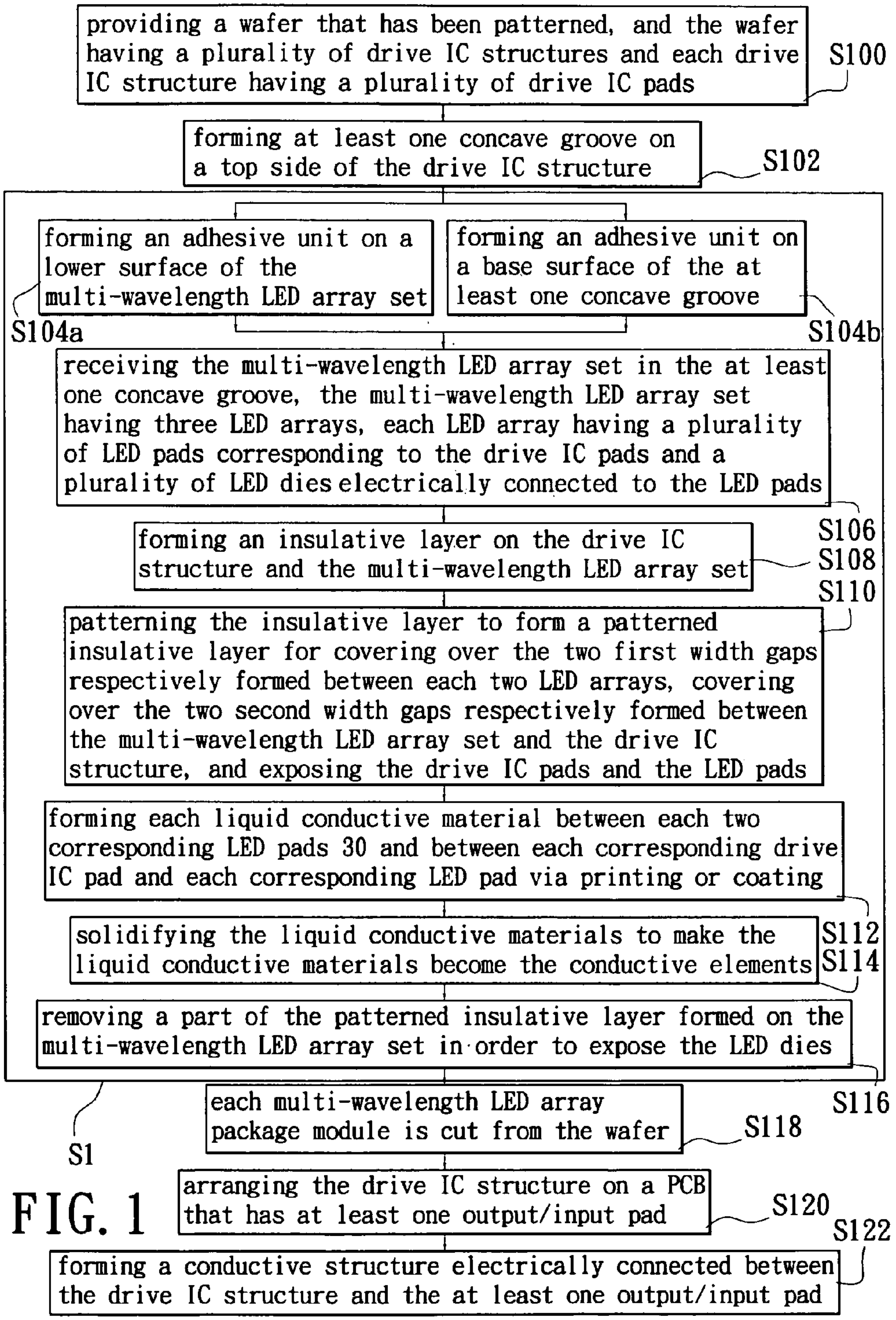
FIG. 1 is a flow chart of a method for packaging a multi-wavelength LED array package module according to the first embodiment of the present invention.

Referring to FIG. 5A1, the method includes forming an adhesive unit 2 on a lower surface 300 of the multi-wavelength LED array set 3 (S104*a*). Alternatively, referring to FIG. 5A2, the method includes forming an adhesive unit 2 on a base surface 110 of the at least one concave groove 11 (S104*b*). The multi-wavelength LED array set 3 has a first wavelength LED array 31, a second wavelength LED array 32 and a third wavelength LED array 33, and the wavelengths of the three LED arrays 31, 32, 33 are different.

Figure 3:
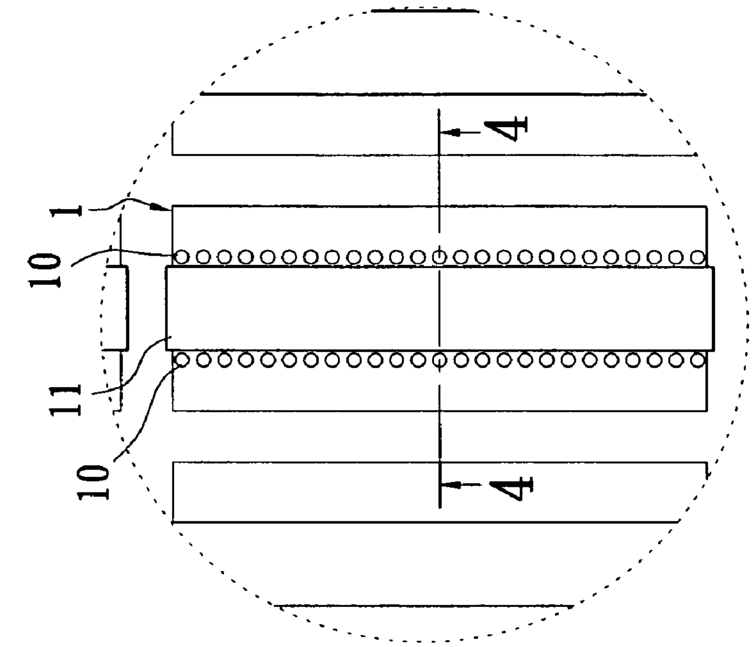
FIG. 3 is an enlarged view of part A of FIG. 2.

Referring to FIG. 5A3, the adhesive unit 2 is divided into three adhesive elements. For example, the adhesive unit 2 has a first adhesive element 21 corresponding to the first wavelength LED array 31, a second adhesive element 22 corresponding to the second wavelength LED array 32, and a third adhesive element 23 corresponding to the third wavelength LED array 33. In addition, the adhesive unit 2 can be a silver adhesive, a polymide, or any adhesive colloid.

Figure 2:
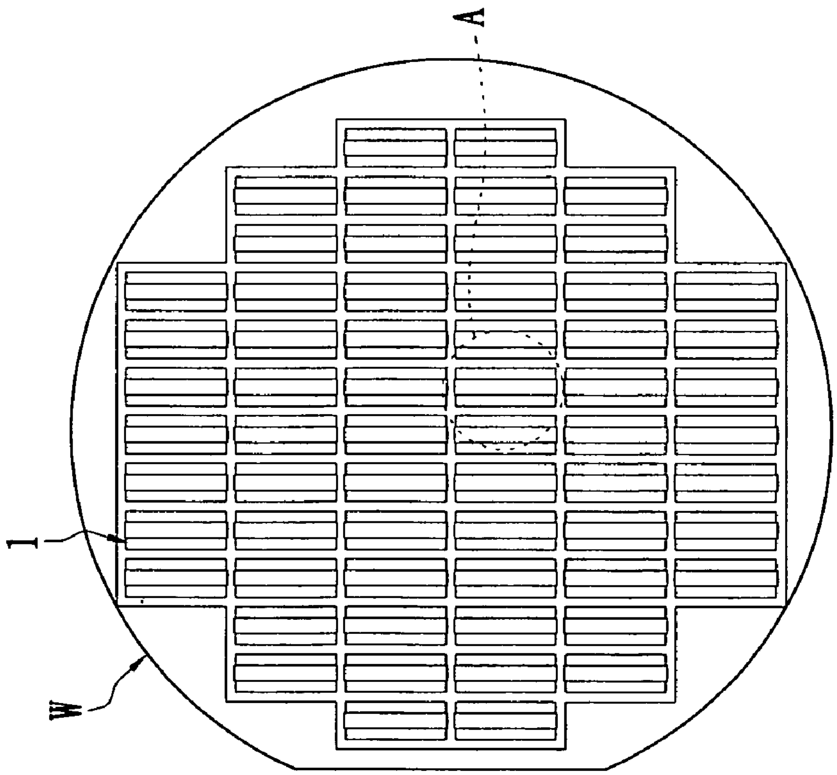
FIG. 2 is a schematic view of a wafer that has been patterned.
Figure 4:
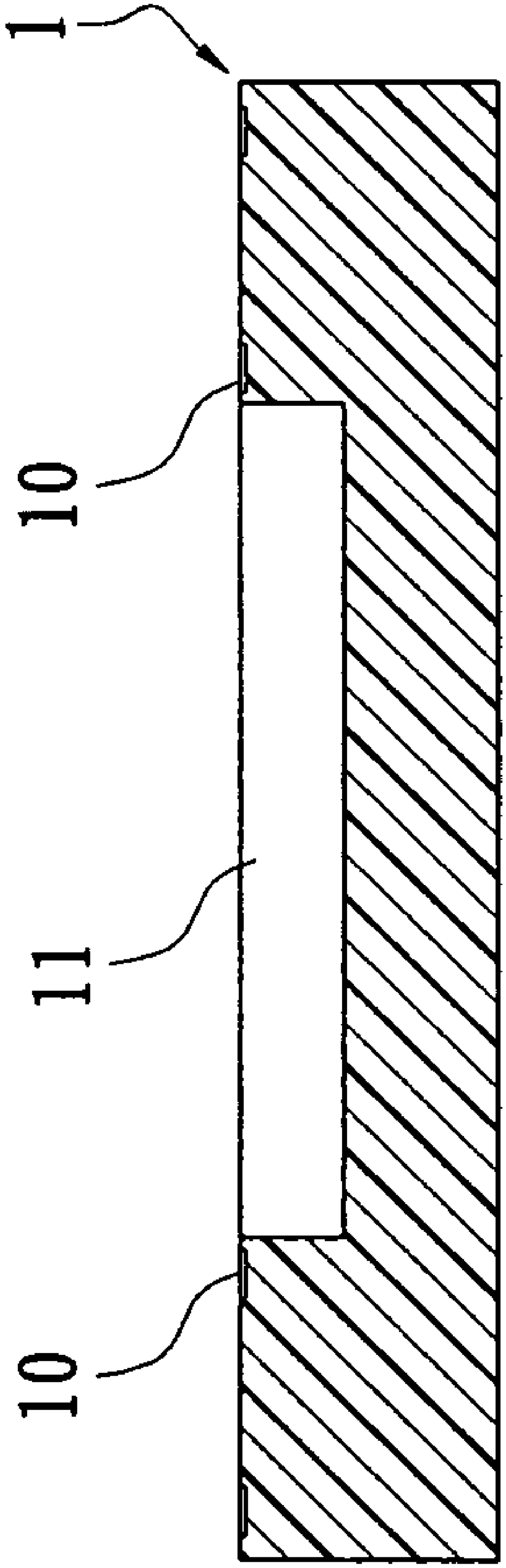
FIG. 4 is a cross-sectional view along line 4-4 of FIG. 2.

Referring to FIGS. 5B1 and 5B2 (FIG. 5B1 is a cross-sectional view and FIG. 5B2 is a top view), the method of the first embodiment further includes: receiving the multi-wavelength LED array set 3 in the at least one concave groove 11, the multi-wavelength LED array set 3 having three LED arrays 31, 32, 33, each LED array (31, 32, or 33) having a plurality of LED pads 30 corresponding to the drive IC pads 10 and a plurality of LED dies (L1, L2, or L3) electrically connected to the LED pads 30 (S106).

In other words, the multi-wavelength LED array set 3 is received in the at least one concave groove 11 in order to arrange the adhesive unit 2 between the multi-wavelength LED array set 3 and the drive IC structure 1. In addition, the first wavelength, the second wavelength, and the three wavelength LED arrays 31, 32, 33 are parallel to each other. The second wavelength LED array 32 is arranged between the first wavelength LED array 31 and the third wavelength LED array 33. The drive IC pads 10 are arranged on the two sides of the drive IC structure. The first wavelength LED array 31 has a plurality of LED pads 30 arranged on two sides thereof and a plurality of LED dies L1 electrically connected with the corresponding LED pads 30 on one side thereof. The second wavelength LED array 32 has a plurality of LED pads 30 arranged on two sides thereof and a plurality of LED dies L2 electrically connected with the corresponding LED pads 30 on the two sides thereof. The third wavelength LED array 33 has a plurality of LED pads 30 arranged on two sides thereof and a plurality of LED dies L3 electrically connected with the corresponding LED pads 30 on one side thereof.

Furthermore, there is a first width gap G1 formed between each two LED arrays. In other words, there is a first width gap G1 formed between the first wavelength LED array 31 and the second wavelength LED array 32, and there is another first width gap G1 formed between the second wavelength LED array 32 and the third wavelength LED array 33. Moreover, there are two second width gaps G2 formed between the multi-wavelength LED array set 3 and the drive IC structure 1. A width of each width gap G1 or G2 is between 5 μm and 10 μm. A height of each width gap G1 or G2 is about 10 μm.

Figure 5C:
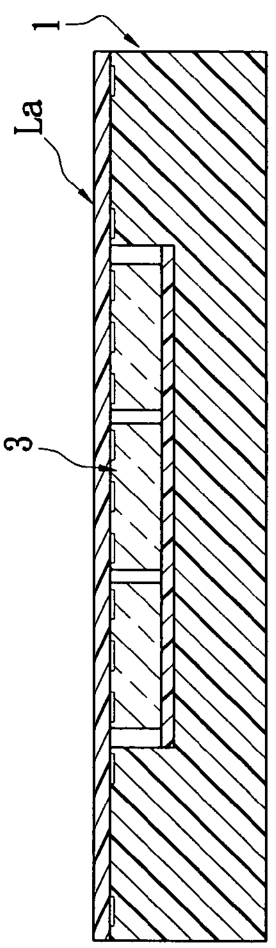

Referring to FIG. 5C, the method of the first embodiment further includes: forming an insulative layer La on the drive IC structure 1 and the multi-wavelength LED array set 3 (S108). The insulative layer La is a positive photo resist. In other words, the insulative layer La is formed on the drive IC structure 1 and the multi-wavelength LED array set 3 via a coating process and a pre-cure process.

Figure 5D:
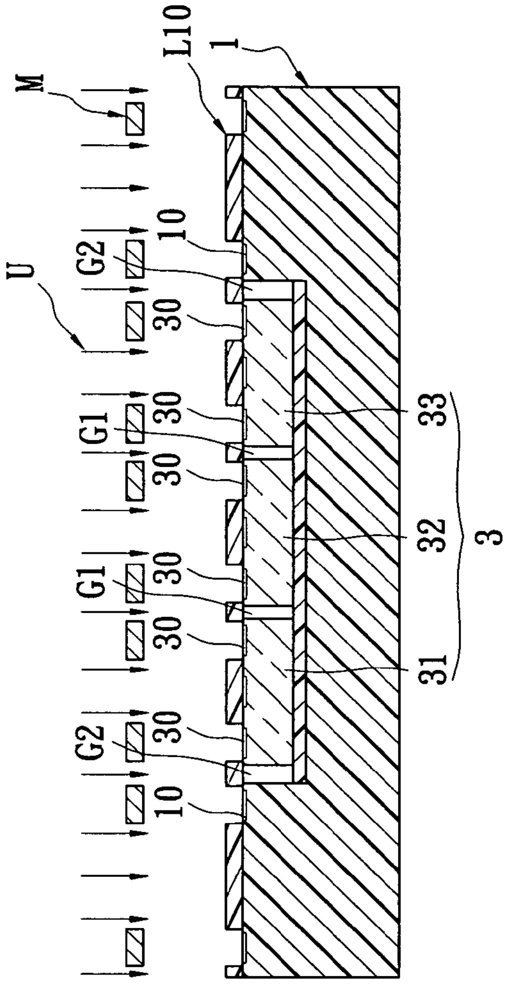

Referring to FIG. 5D, the method of the first embodiment further includes: patterning the insulative layer La to form a patterned insulative layer L10 for "covering over the two first width gaps G1 respectively formed between each two LED arrays (it means between the first wavelength LED array 31 and the second wavelength LED array 32, and between the second wavelength LED array 32 and the third wavelength LED array 33)", "covering over the two second width gaps G2 respectively formed between the multi-wavelength LED array set 3 and the drive IC structure 1", and "exposing the drive IC pads 10 and the LED pads 30 (S110). In other words, the patterned insulative layer L10 is formed via using UV light to illuminate the insulative layer La and using a mask M with a predetermined pattern to shade a part of the insulative layer La from the UV light.

Referring to FIG. 5E1 (before curing), the method of the first embodiment further includes: forming each liquid conductive material 40*a*' between "each two corresponding LED pads 30 (it means between the first wavelength LED array 31 and the second wavelength LED array 32, and between the second wavelength LED array 32 and the third wavelength LED array 33)" and "each corresponding drive IC pad 10 and each corresponding LED pad 30" via printing or coating (S112) such as using a printing head H1.

Referring to FIG. 5E2 (after curing), the method of the first embodiment further includes: solidifying the liquid conductive materials 40*a*' to make the liquid conductive materials 40*a*' become the conductive elements 40*a*" (S114). In other words, the conductive elements 40*a*' are formed between "each two corresponding LED pads 30 (it means between the first wavelength LED array 31 and the second wavelength LED array 32, and between the second wavelength LED array 32 and the third wavelength LED array 33)" and "each corresponding drive IC pad 10 and each corresponding LED pad 30".

In other words, a first part of the conductive elements 40*a*' are electrically connected between the corresponding drive IC pad 10 on one side of the drive IC structure 1 and the corresponding LED pad 30 on one side of the first wavelength LED array 31. A second part of the conductive elements 40*a*' are electrically connected between the corresponding LED pad 30 on the other side of the first wavelength LED array 31 and the corresponding LED pad 30 on one side of the second wavelength LED array 32. A third part of the conductive elements 40*a*' are electrically connected between the corresponding LED pad 30 on the other side of the second wavelength LED array 32 and the corresponding LED pad 30 on one side of the third wavelength LED array 33. A fourth part of the conductive elements 40*a*' are electrically connected between the corresponding LED pad 30 on the other side of the third wavelength LED array 33 and the corresponding drive IC pad 10 on the other side of the drive IC structure 1.

Figure 5F:
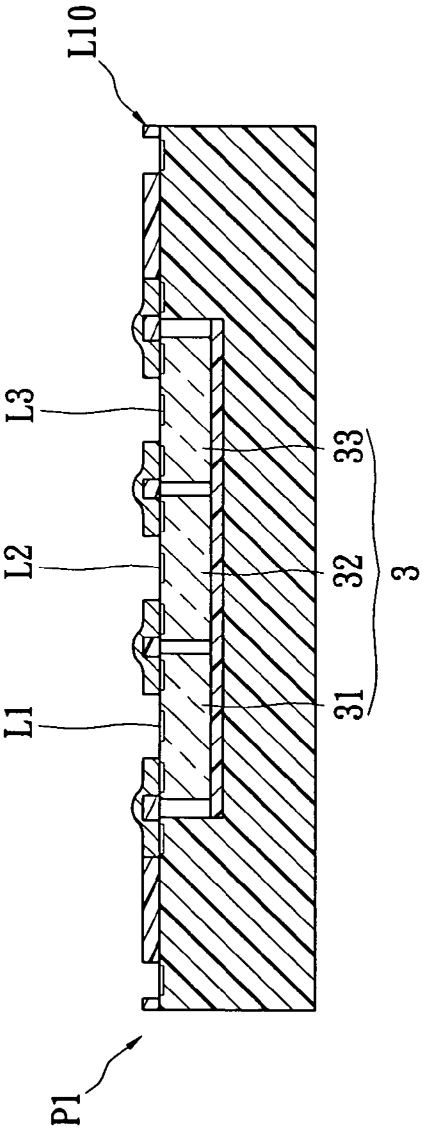

Referring to FIG. 5F, the method of the first embodiment further includes: removing a part of the patterned insulative layer L10 formed on the multi-wavelength LED array set 3 in order to expose the LED dies L1, L2, L3 (S116) to accomplish the multi-wavelength LED array package module P1.

Furthermore, after the step S116, each multi-wavelength LED array package module P1 is cut from the wafer W (S118). It means that each drive IC structure 1 is cut from a wafer W that has been patterned.

Figure 5G:
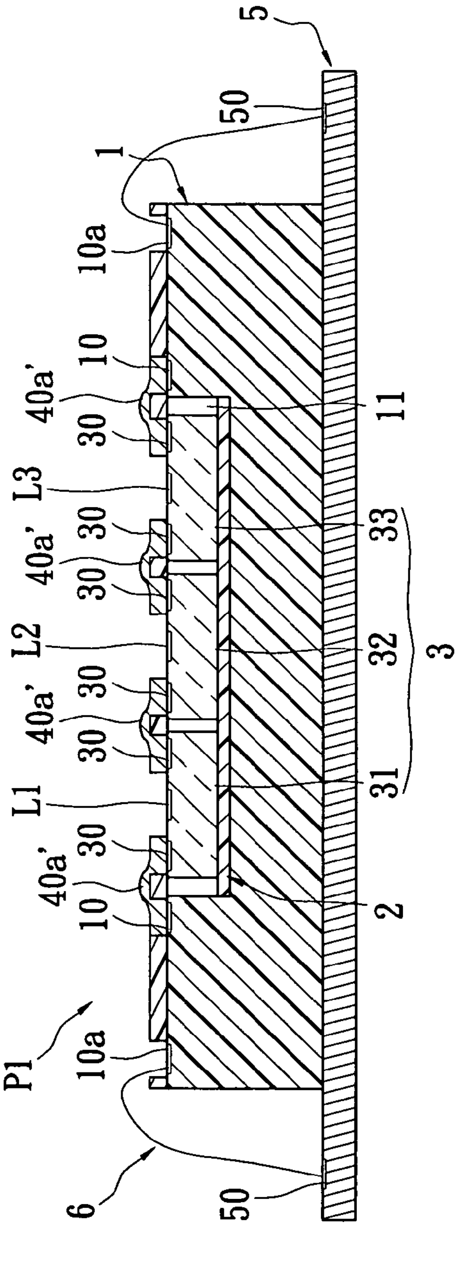

Referring to FIG. 5G, the method of the first embodiment further includes: arranging the drive IC structure 1 on a PCB 5 that has at least one output/input pad 50 (FIG. 5G shows a pair of output/input pads 50) (S120); and forming a conductive structure 6 electrically connected between the drive IC structure 1 and the at least one output/input pad 50 (FIG. 5G shows a pair of conductive structures 6) (S122). The conductive structure 6 is formed between one power pad 10*a* of the drive IC structure 1 and the at least one output/input pad 50 (FIG. 5G shows two pairs of power pad 10*a* and the at least one output/input pad 50) via a wire-bonding process.

Referring to FIG. 5G again, the multi-wavelength LED array package module P1 includes a drive IC structure 1, an adhesive unit 2, a multi-wavelength LED array set 3, and a plurality of conductive elements 40*a*'. The drive IC structure 1 has at least one concave groove 11 and a plurality of drive IC pads 10 formed on a top side thereof. The adhesive unit 2 is formed between the multi-wavelength LED array set 3 and the drive IC structure 1. The multi-wavelength LED array set 3 is received in the at least one concave groove 11. The multi-wavelength LED array set 3 has a plurality of LED pads 30 and a plurality of LED dies L1, L2, L3 corresponding to the LED pads 30. The conductive elements 40*a*' is electrically connected between the drive IC structure 1 and the multi-wavelength LED array set 3 (Each conductive element 40*a*' is electrically connected between each corresponding drive IC pad 10 and each corresponding LED pad 30).

Moreover, the multi-wavelength LED array package module P1 can be arranged on a PCB 5 that has at least one output/input pad 50. A conductive structure 6 is electrically connected between the power pad 1*a* and the at least one output/input pad 50.

Referring to FIGS. 6 and 7A to 7E, the step S2 discloses the manufacturing processes of each drive IC structure 1. The step S2 includes the step S204*a* to step S216.

Figure 6:
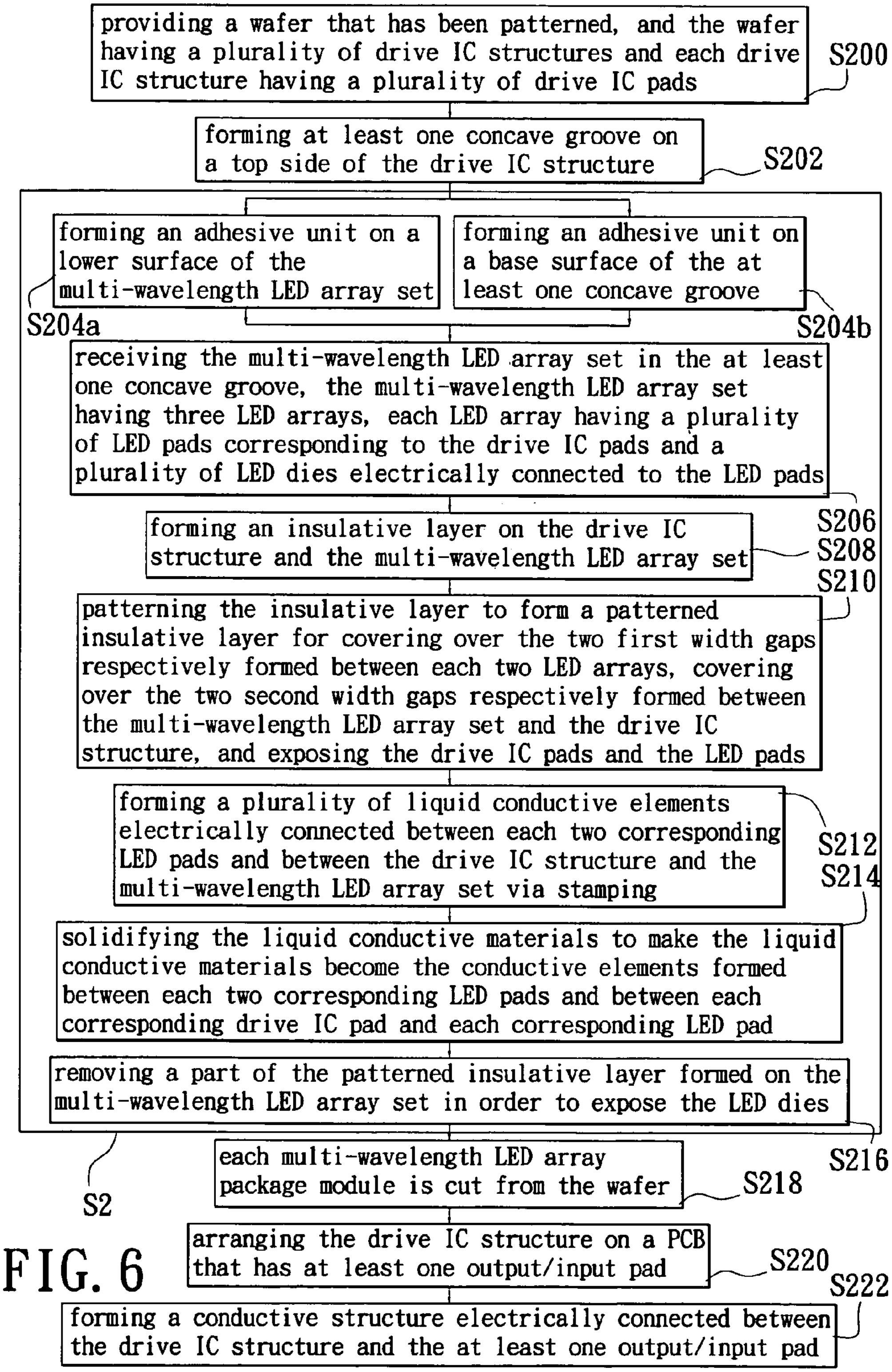
FIG. 6 is a flow chart of a method for packaging a multi-wavelength LED array package module according to the second embodiment of the present invention.

Referring to FIGS. 1 and 6, the steps S200 to S210 and the steps S216 to S222 of the second embodiment are same as the steps S100 to S110 and the steps S116 to S122 of the first embodiment. The difference between the second embodiment and the first embodiment is that forming a plurality of liquid conductive elements 40*b* electrically connected "between each two corresponding LED pads 30" and "between the drive IC structure 1 and the multi-wavelength LED array set 3 (between each corresponding drive IC pad 10 and each corresponding LED pad 30)" via stamping.

Figure 7A:
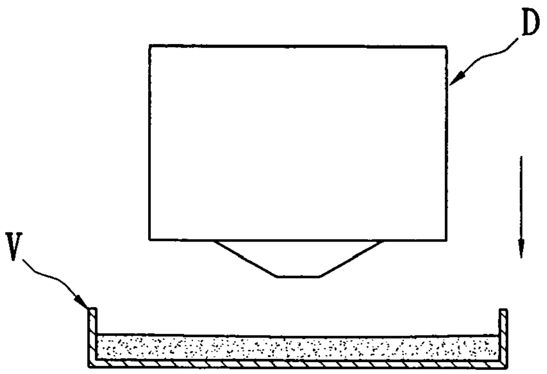
Figure 7B:
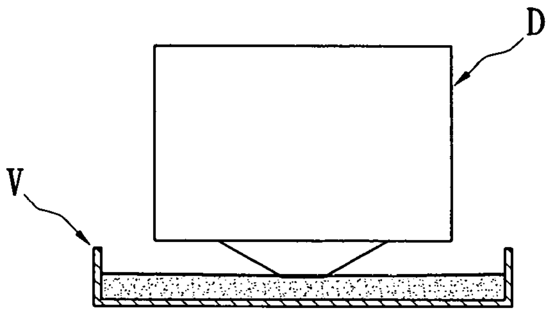
Figure 7C:
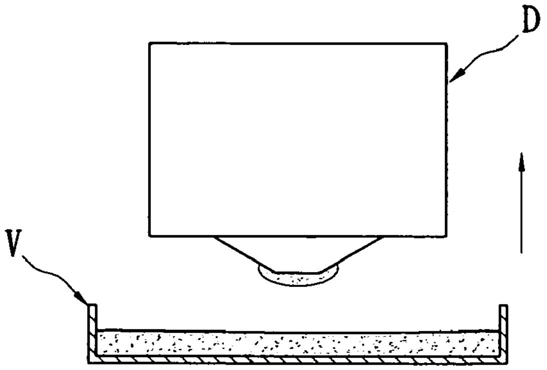

Referring to FIGS. 7A to 7D1, after the step S210, the method of the second embodiment further includes: forming a plurality of liquid conductive elements 40*b* electrically connected "between each two corresponding LED pads 30" and "between the drive IC structure 1 and the multi-wavelength LED array set 3 (between each corresponding drive IC pad 10 and each corresponding LED pad 30)" via stamping (S212). In other words, the method of the second embodiment further includes repeatedly stamping the liquid conductive materials 40*b* from a vessel V to a place "between each two corresponding LED pads 30" and "between each corresponding drive IC pad 10 and each corresponding LED pad 30" via a stamping device D (the steps of FIGS. 7A to 7D1 are repeated). Therefore, each liquid conductive material 40*b* is electrically connected "between each two corresponding LED pads 30" and "between each corresponding drive IC pad 10 and each corresponding LED pad 30".

Referring to FIG. 7D2, the method of the second embodiment further includes: solidifying the liquid conductive materials 40*b* to make the liquid conductive materials 40*b* become the conductive elements 40*b*' formed "between each two corresponding LED pads 30" and "between each corresponding drive IC pad 10 and each corresponding LED pad 30" (S214). In other words, each conductive element 40*b*' is electrically connected "between each two corresponding LED pads 30" and "between each corresponding drive IC pad 10 and each corresponding LED pad 30" via stencil printing and solidifying.

Figure 7E:
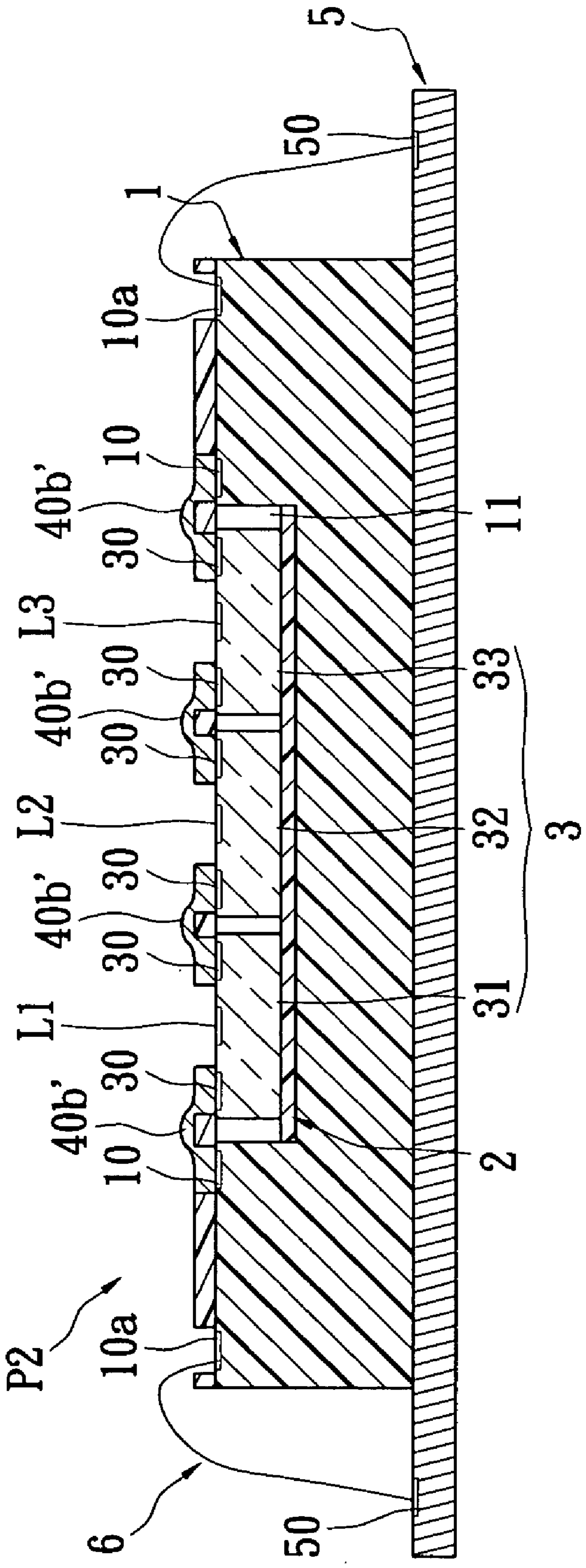

Referring to FIG. 7E, the method of the second embodiment further includes: removing a part of the patterned insulative layer L10 formed on the multi-wavelength LED array set 3 in order to expose the LED dies L1, L2, L3 (S216) to accomplish the multi-wavelength LED array package module P2.

Referring to FIGS. 8 and 9A to 9C, the step S3 discloses the manufacturing processes of each drive IC structure 1. The step S3 includes the step S304*a* to step S318.

Figure 8:
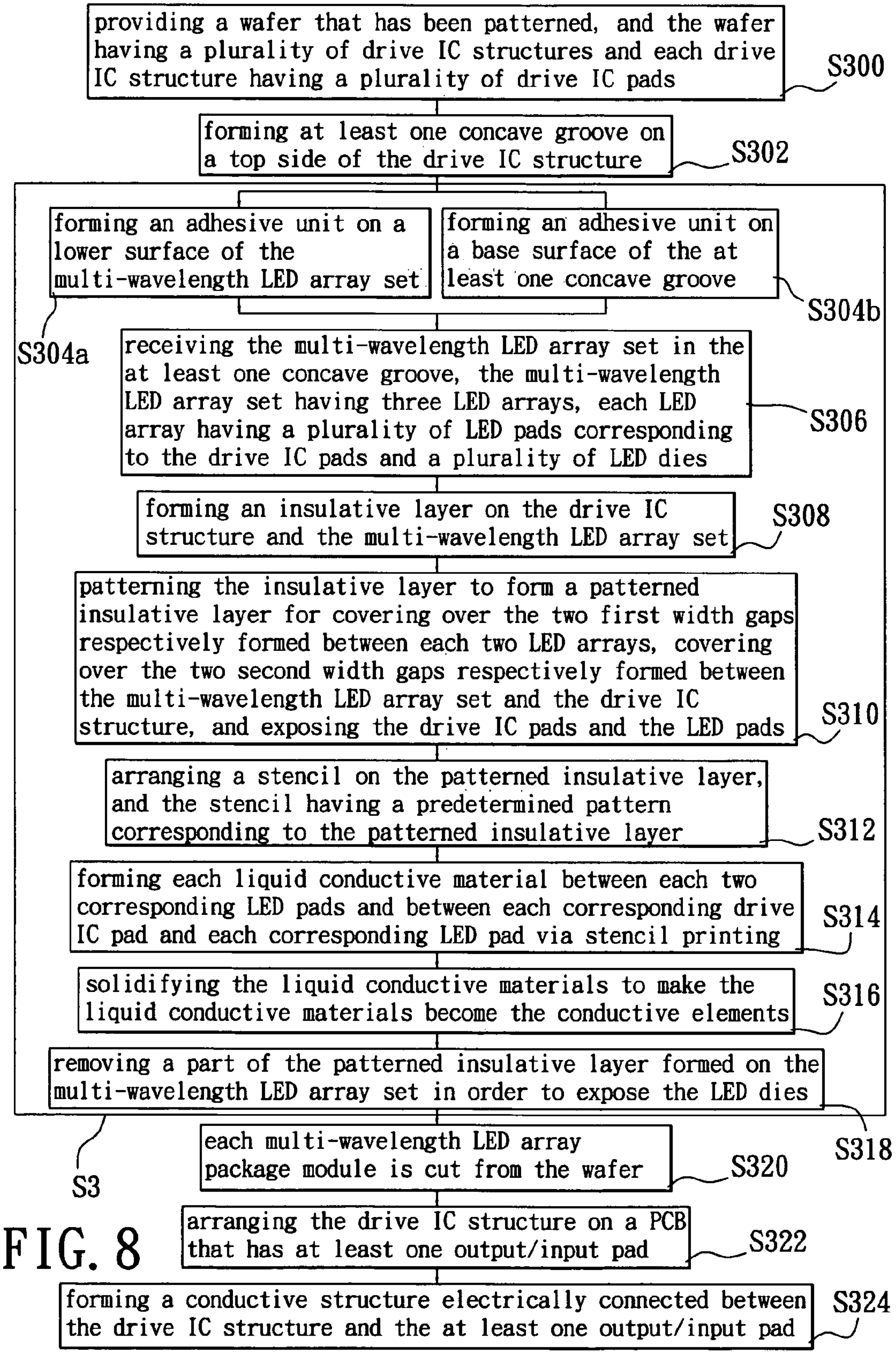
FIG. 8 is a flow chart of a method for packaging a multi-wavelength LED array package module according to the third embodiment of the present invention.

Referring to FIG. 8, the steps S300 to S310 and the steps S318 to 5324 of the third embodiment are same as the steps S100 to S110 and the steps S116 to S122 of the first embodiment. The difference between the third embodiment and the first embodiment (or the second embodiment) is that forming a plurality of liquid conductive elements 40*c* electrically connected "between each two corresponding LED pads 30" and "between each corresponding drive IC pad 10 and each corresponding LED pad 30" via stencil printing. In other words, each conductive element 40*c*' is electrically connected "between each two corresponding LED pads 30" and "between each corresponding drive IC pad 10 and each corresponding LED pad 30" via stencil printing and solidifying.

Referring to FIG. 9A, after the step S310, the method of the third embodiment further includes: arranging a stencil 7 on the patterned insulative layer L10, and the stencil 7 having a predetermined pattern 70 corresponding to the patterned insulative layer L10 (S312). Hence, a concave groove is formed "between each two corresponding LED pads 30" and "between each corresponding drive IC pad 10 and each corresponding LED pad 30" via matching the patterned insulative layer L10 and the predetermined pattern 70 of the stencil 7.

Referring to FIG. 9B1, the method of the third embodiment further includes: forming each liquid conductive material 40*c* "between each two corresponding LED pads 30" and "between each corresponding drive IC pad 10 and each corresponding LED pad 30" via stencil printing (S314). In other words, each liquid conductive material 40*c* is formed "between each two corresponding LED pads 30" and "between each corresponding drive IC pad 10 and each corresponding LED pad 30" via matching the patterned insulative layer L10 and the predetermined pattern 70 of the stencil 7 and using a printing head H2.

Referring to FIG. 9B2, the method of the third embodiment further includes: solidifying the liquid conductive materials 40*c* to make the liquid conductive materials 40*c* become the conductive elements 40*c*' (S316).

Figure 9C:
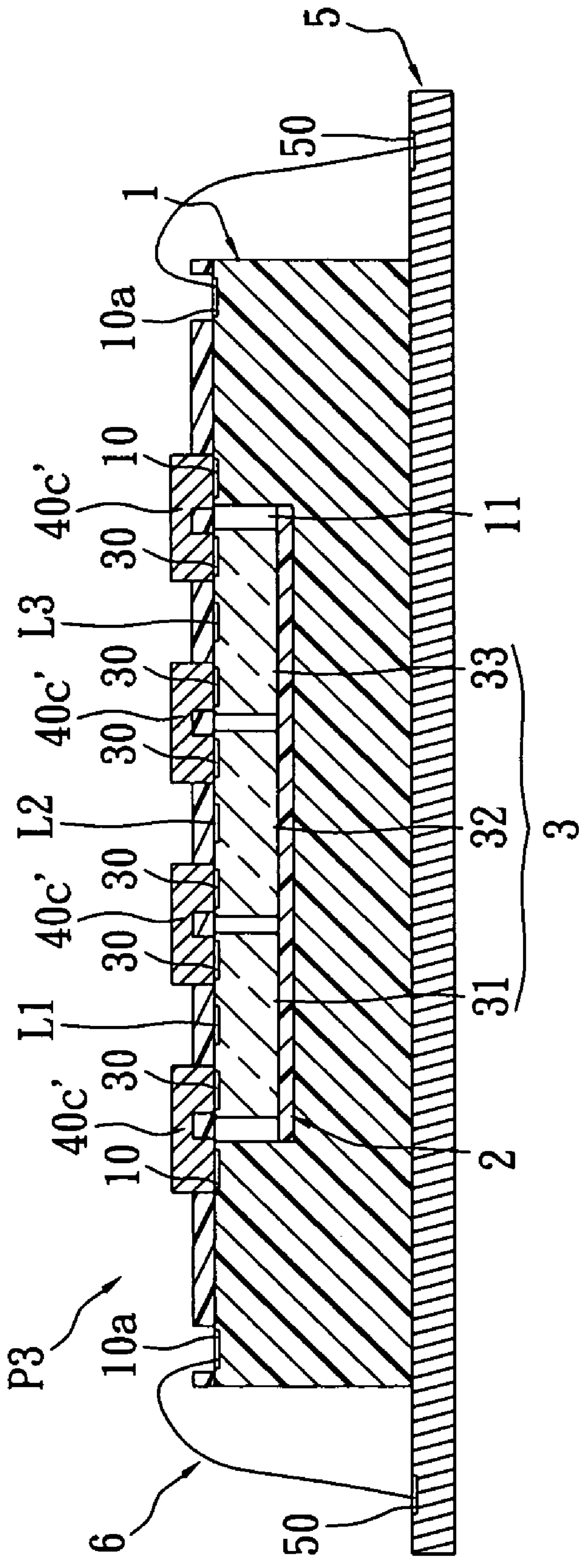

Referring to FIG. 9C, the method of the third embodiment further includes: removing a part of the patterned insulative layer L10 formed on the multi-wavelength LED array set 3 in order to expose the LED dies L1, L2, L3 (S318) to accomplish the multi-wavelength LED array package module P3.

Referring to FIGS. 10 and 11A to 11E, the step S4 discloses the manufacturing processes of each drive IC structure 1. The step S4 includes the step S404*a* to step S418.

Figure 10:
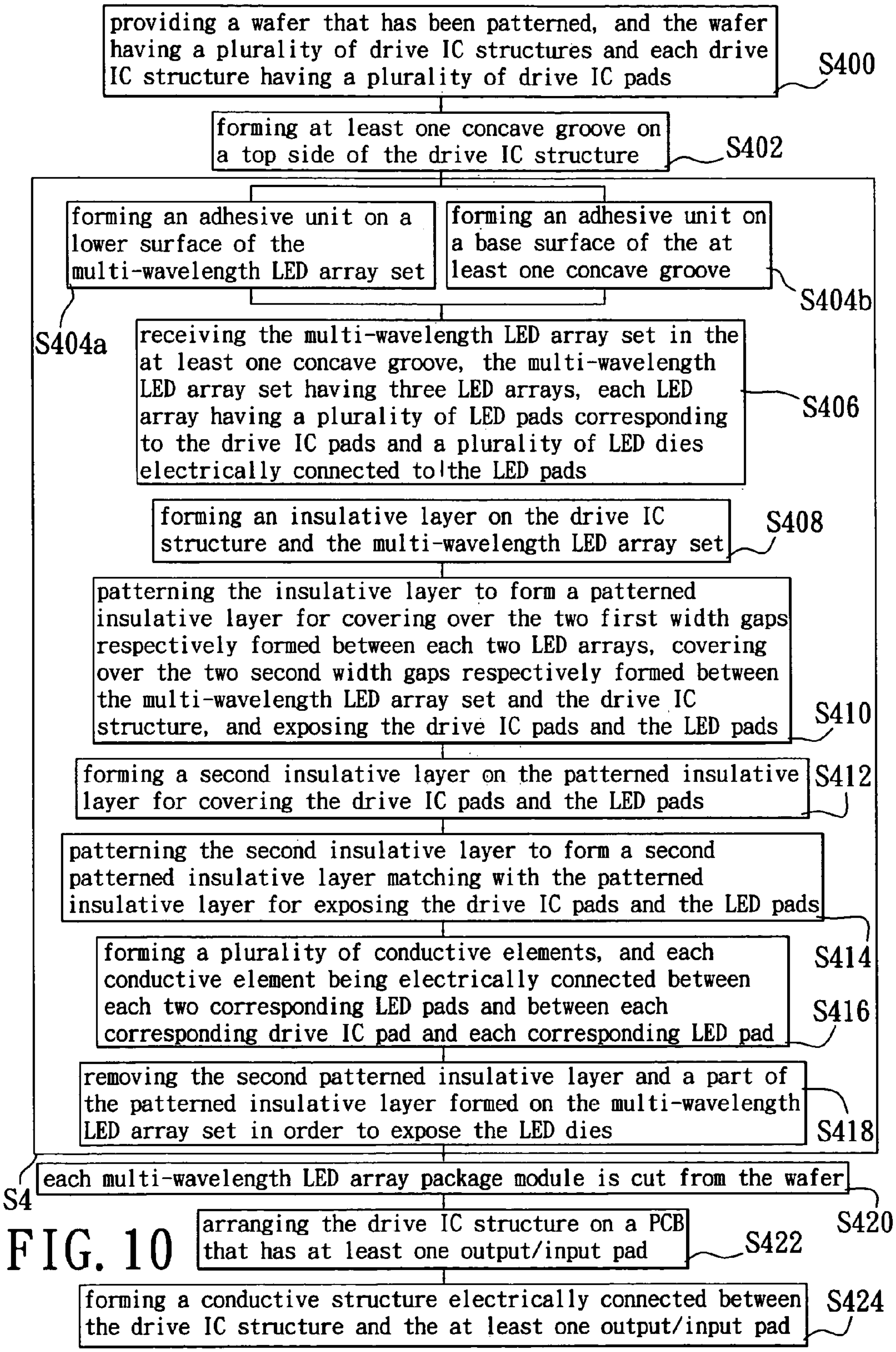
FIG. 10 is a flow chart of a method for packaging a multi-wavelength LED array package module according to the fourth embodiment of the present invention.

Referring to FIG. 10, the steps S400 to S410 and the steps S420 to S424 of the fourth embodiment are same as the steps S100 to S110 and the steps S118 to S122 of the first embodiment.

Figure 11A:
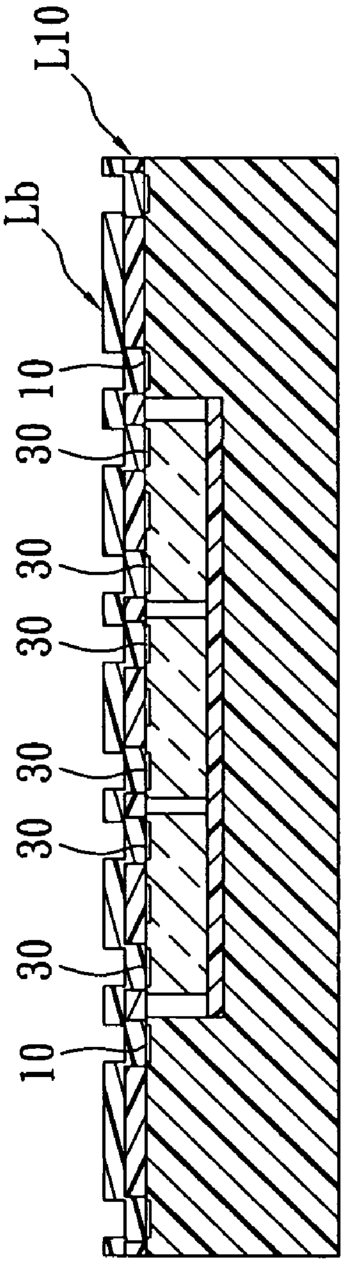

Referring to FIG. 11A, after the step S410, the method of the fourth embodiment further includes: forming a second insulative layer Lb on the patterned insulative layer L10 for covering the drive IC pads 10 and the LED pads 30 (S412).

Figure 11B:
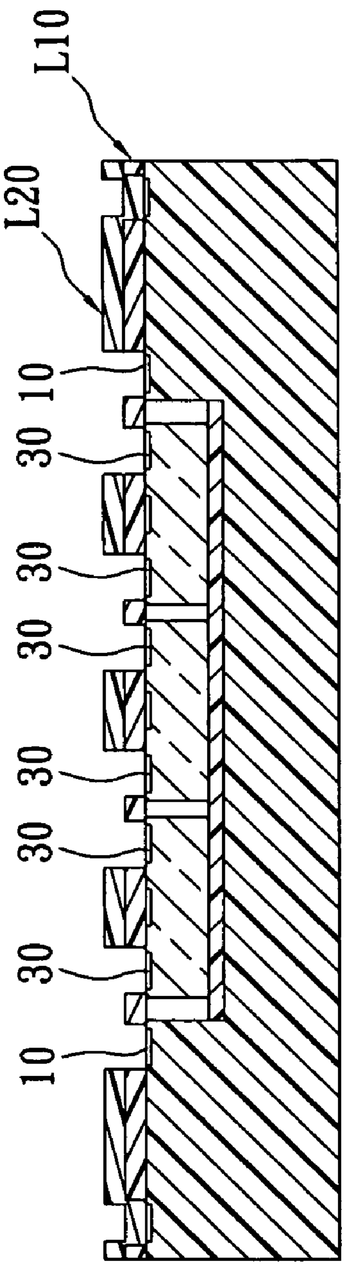

Referring to FIG. 11B, the method of the fourth embodiment further includes: patterning the second insulative layer Lb (the process is the same as FIG. 5D) to form a second patterned insulative layer L20 matching with the patterned insulative layer L10 for exposing the drive IC pads 10 and the LED pads 30 again (S414). Hence, a concave groove is formed "between each two corresponding LED pads 30" and "between each corresponding drive IC pad 10 and each corresponding LED pad 30" via the matching of the patterned insulative layer L10 and the second patterned insulative layer L20.

Referring to FIGS. 11C1 and 11C2 (FIG. 11C1 is a cross-sectional view and FIG. 11C2 is a top view), the method of the fourth embodiment further includes: forming a plurality of conductive elements 40D, and each conductive element 40D being electrically connected "between each two corresponding LED pads 30" and "between each corresponding drive IC pad 10 and each corresponding LED pad 30" (S416). In other words, the conductive elements 40D are formed via vapor plating, sputtering, spraying, or coating process.

Figure 11D:
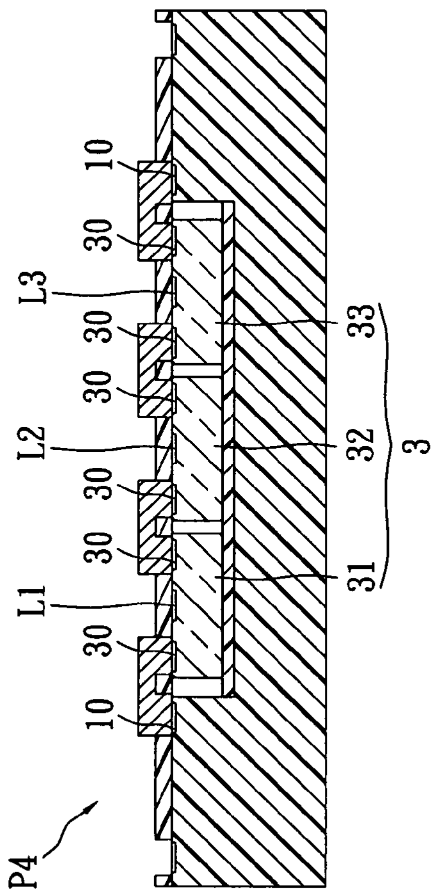
Figure 11E:
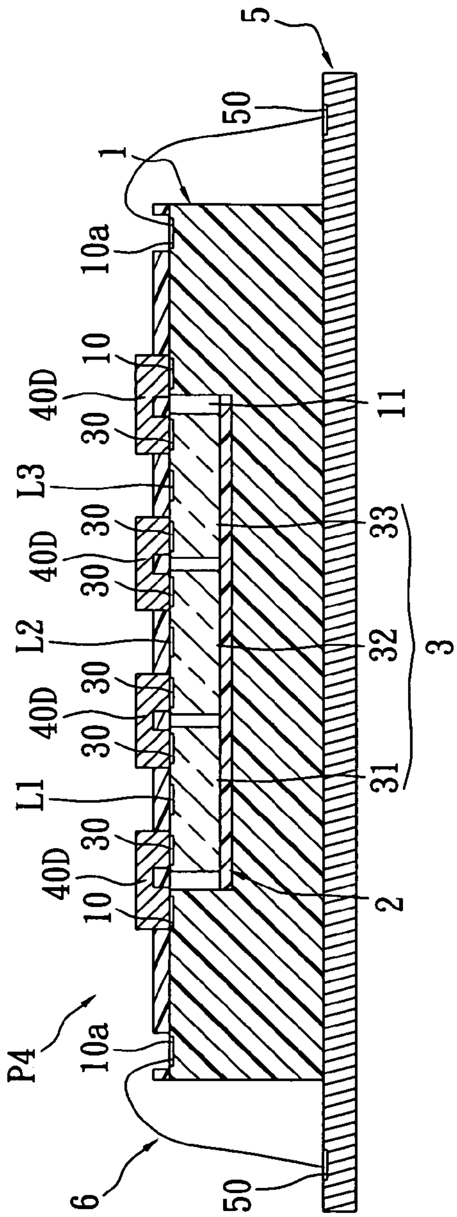

Referring to FIG. 11D, the method of the fourth embodiment further includes: removing the second patterned insulative layer L2 and a part of the patterned insulative layer L10 formed on the multi-wavelength LED array set 3 in order to expose the LED dies L1, L2, L3 (S418) to accomplish the LED array module P4.

Furthermore, the drive IC pads 10 can be arranged on the drive IC structure 1 along a sawtooth-shaped track. The LED pads 30 can be arranged on the multi-wavelength LED array set 3 along a sawtooth-shaped track. Therefore, the LED dies L1, L2, L3 of the multi-wavelength LED array set 3 can be arranged compactly together. Moreover, according to different design needs, the drive IC pads 10 are selectively arranged on the drive IC structure 1 along a sawtooth-shaped track or a straight track. The LED pads 30 are selectively arranged on the multi-wavelength LED array set 3 along a sawtooth-shaped track or a straight track.

In conclusion, the multi-wavelength LED array package module (P1, P2, P3, P4) is a light exposure module that can be applied to EPG (Electrophotography) printer.

Moreover, the feature of the present invention includes: etching at least one concave groove 11 on the drive IC structure 1; arranging a light-emitting element array such as an LED array in the at least one concave groove 11; and then achieving high density electrical connection with 600~1200 dip via printing, coating, stamping or stencil printing. Hence, the present invention can reduce product size, material cost, and manufacturing cost due to high density electrical connection.

Hence, the conductive structure is electrically connected between the multi-wavelength LED array set and the drive IC structure and between each two LED arrays without using wire-bonding process such as prior art that needs to take a long time. Hence, the present invention not only can reduce product size, material cost, and manufacturing cost, but also increases production speed.

Moreover, the multi-wavelength LED array package module of the present invention is not a mechanical scanner type but is a small-sized multi-wavelength light output device. The module of the present invention can applied to many portable electronic devices such as notebook, laptop, PDA, and mobile phone etc. for achieving the purpose of movable color printing.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A multi-wavelength LED array package module, comprising:

a drive IC structure having at least one concave groove formed on a top side thereof;

a multi-wavelength LED array set disposed in the at least one concave groove, the multi-wavelength LED array set defining a plurality of wavelength LED arrays with each of the wavelength LED array being adjacently displaced from one another by a first gap, the multi-wavelength LED array set being displaced from the drive IC structure by a second gap, and each of the top surface of the multi-wavelength LED array being substantially coplanar with the drive IC structure;

a plurality of patterned insulative layers traversing each of the first and second gaps; and a plurality of conductive elements electrically connected between the drive IC structure and the multi-wavelength LED array set; wherein each patterned insulative layer is covered by one of the conductive elements;

wherein the wavelength of each of the plurality of wavelength LED arrays is different and the multi-wavelength LED array set has a first wavelength LED array, a second wavelength LED array and a third wavelength LED array, and the second wavelength LED array is disposed between the first wavelength LED array and the third wavelength LED array;

wherein the drive IC structure has a plurality of drive IC pads arranged on two sides thereof, and each LED array has a plurality of LED pads disposed on two sides thereof and a plurality of LED dies, the LED dies of the first wavelength LED array are electrically connected with the corresponding LED pads on one side thereof, the LED dies of the second wavelength LED array are electrically connected with the corresponding LED pads on the two side thereof, and the LED dies of the third wavelength LED array are electrically connected with the corresponding LED pads on one side thereof;

wherein a first part of the conductive elements are electrically connected between the corresponding drive IC pads on one side of the drive IC structure and the corresponding LED pads on one side of the first wavelength LED array, a second part of the conductive elements are electrically connected between the corresponding LED pads on the other side of the first wavelength LED array and the corresponding LED pads on one side of the second wavelength LED array, a third part of the conductive elements are electrically connected between the corresponding LED pads on the other side of the second wavelength LED array and the corresponding LED pads on one side of the third wavelength LED array, and a fourth part of the conductive elements are electrically connected between the corresponding LED pads on the other side of the third wavelength LED array and the corresponding drive IC pads on the other side of the drive IC structure.

2. A multi-wavelength LED array package module, comprising:

a drive IC structure having at least one concave groove formed on a topside thereof;

a multi-wavelength LED array set formed by a plurality of LED arrays, each of said LED arrays having a specific wavelength, said multi-wavelength LED array set is disposed in the at least one concave groove, the multi-wavelength LED array set defining a plurality of wavelength LED arrays with each of the wavelength LED arrays having a specific wavelength and being adjacently displaced from one another by a first gap, the multi-wavelength LED array set being displaced from the drive IC structure by a second gap, and each of the top surfaces of the multi-wavelength LED array set being substantially coplanar with the drive IC structure; and a plurality of patterned insulative layers traversing each of the first and second gaps; and a plurality of conductive elements electrically connected between the drive IC structure and the multi-wavelength LED array set; wherein each patterned insulative layer is covered by one of the conductive elements.

3. The multi-wavelength LED array package module as claimed in claim 2, further comprising an adhesive unit disposed between the multi-wavelength LED array set and the drive IC structure.

4. The multi-wavelength LED array package module as claimed in claim 2, wherein the wavelength of each of the plurality of wavelength LED arrays is different and the multi-wavelength LED array set has a first wavelength LED array, a second wavelength LED array and a third wavelength LED array, and the second wavelength LED array is disposed between the first wavelength LED array and the third wavelength LED array.

5. The multi-wavelength LED array package module as claimed in claim 4, wherein the drive IC structure has a plurality of drive IC pads arranged on two sides thereof, and each LED array has a plurality of LED pads disposed on two sides thereof and a plurality of LED dies, the LED dies of the first wavelength LED array are electrically connected with the corresponding LED pads on one side thereof, the LED dies of the second wavelength LED array are electrically connected with the corresponding LED pads on the two side thereof, and the LED dies of the third wavelength LED array are electrically connected with the corresponding LED pads on one side thereof.

6. The multi-wavelength LED array package module as claimed in claim 5, wherein the drive IC pads on the same side of the drive IC structure are arranged along a straight track, and the LED pads on the same side of the multi-wavelength LED array set are arranged along a straight track.

7. The multi-wavelength LED array package module as claimed in claim 5, wherein the drive IC pads on the same side of the drive IC structure are arranged along a sawtooth-shaped track, and the LED pads on the same side of the multi-wavelength LED array set are arranged along a sawtooth-shaped track.

8. The multi-wavelength LED array package module as claimed in claim 5, wherein the drive IC pads on the same side of the drive IC structure are selectively arranged along a straight track and a sawtooth-shaped track, and the LED pads on the same side of the multi-wavelength LED array set are selectively arranged along a straight track and a sawtooth-shaped track.

9. The multi-wavelength LED array package module as claimed in claim 2, wherein the width of the first gap is between 5 μm and 10 μm.

10. The multi-wavelength LED array package module as claimed in claim 2, wherein the width of the second gap is between 5 μm and 10 μm.

11. The multi-wavelength LED array package module as claimed in claim 2, further comprising a PCB (Printed Circuit Board) and a conductive structure, wherein the PCB has at least one output/input pad, the drive IC structure is arranged on the PCB, and the conductive structure are electrically connected between the drive IC structure and the at least one output/input pad.

* * * * *